(12) United States Patent
Tamura et al.

(10) Patent No.: US 9,401,581 B2
(45) Date of Patent: Jul. 26, 2016

(54) JIG FOR CAN-PACKAGE SEMICONDUCTOR LASER

(71) Applicant: Hitachi Metals, Ltd., Minato-ku, Tokyo (JP)

(72) Inventors: Kenichi Tamura, Hitachi (JP); Yoshinori Sunaga, Hitachinaka (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/469,034

(22) Filed: Aug. 26, 2014

(65) Prior Publication Data

US 2015/0349489 A1    Dec. 3, 2015

(30) Foreign Application Priority Data

May 28, 2014   (JP) ................. 2014-110543

(51) Int. Cl.
*H01S 5/022* (2006.01)
*H01S 5/042* (2006.01)

(52) U.S. Cl.
CPC ......... *H01S 5/02256* (2013.01); *H01S 5/02212* (2013.01); *H01S 5/02236* (2013.01); *H01S 5/02244* (2013.01); *H01S 5/02248* (2013.01); *H01S 5/0425* (2013.01)

(58) Field of Classification Search
CPC . H01L 23/053; H01L 23/055; H01S 5/02212; H01S 5/0425; H01S 5/02236; H01S 5/02248; H01S 5/02244; H01S 5/02256
See application file for complete search history.

(56) References Cited

U.S. PATENT DOCUMENTS

| | | | |
|---|---|---|---|
| 6,841,733 B2* | 1/2005 | Schiaffino et al. | 174/650 |
| 7,972,068 B2* | 7/2011 | Kalberer et al. | 385/94 |
| 2003/0160314 A1* | 8/2003 | Crane, Jr. | G02B 6/4292 257/680 |
| 2007/0212812 A1* | 9/2007 | Chow et al. | 438/106 |
| 2012/0287955 A1* | 11/2012 | Kimura et al. | 372/44.01 |

FOREIGN PATENT DOCUMENTS

JP       2008-85259 A       4/2008

* cited by examiner

*Primary Examiner* — Armando Rodriguez
(74) *Attorney, Agent, or Firm* — Crowell & Moring LLP

(57) ABSTRACT

A jig for handling a CAN-package semiconductor laser having a semiconductor laser mounted on a pedestal, a cap which is put on one surface of the pedestal and covers the semiconductor laser, and a lead pin which is electrically connected to the semiconductor laser and protrudes from the other surface of the pedestal includes: a base part provided with a recessed part to which the pedestal is fitted; a terminal pad provided on a recessed-part bottom surface and being in contact with the lead pin; and a terminal pin electrically connected to the terminal pad and protruding from the base part.

7 Claims, 5 Drawing Sheets

US 9,401,581 B2

JIG FOR CAN-PACKAGE SEMICONDUCTOR LASER

CROSS-REFERENCE TO RELATED APPLICATION

The present application claims priority from Japanese Patent Application No. 2014-110543 filed on May 28, 2014, the content of which is hereby incorporated by reference into this application.

TECHNICAL FIELD OF THE INVENTION

The present invention relates to a semiconductor laser device, and particularly relates to a jig for handling a semiconductor laser device.

BACKGROUND OF THE INVENTION

A CAN-type semiconductor laser device is one type of semiconductor laser devices. The CAN-type semiconductor laser device has a pedestal, a semiconductor laser mounted on the pedestal, a metal cap covering the semiconductor laser, and a plurality of lead pins electrically connected to the semiconductor laser. In other words, a semiconductor laser is housed in a metal container made up of a pedestal and a cap. In the following descriptions, the CAN-type semiconductor laser device as described above is referred to as "CAN-package semiconductor laser".

Since the CAN-package semiconductor laser is used as, for example, a light source of an optical communication module (Japanese Patent Application Laid-Open Publication No. 2008-85259 (Patent Document 1)), the size reduction thereof is required for the improvement of transmission characteristics. Concretely, in order to reduce the transmission loss by shortening the signal transmission distance as much as possible, lead pins, bonding wires and others need to be shortened. For example, the CAN-package semiconductor laser called "TO-56 CAN" which is now in widespread use has a diameter of about 5.6 mm and a height of 3 to 4 mm. However, it is expected that a CAN-package semiconductor laser smaller than the TO-56 CAN and other CAN-package semiconductor lasers is developed and put to practical use according to the requirement mentioned above.

SUMMARY OF THE INVENTION

As described above, the size reduction of a CAN-package semiconductor laser is expected. On the other hand, most of the manufacturing process of the CAN-package semiconductor laser is automated, and a large quantity of CAN-package semiconductor lasers are manufactured by manufacturing equipment. Also, for the CAN-package semiconductor laser, screening test and other tests are performed before shipment and mounting thereof, and these tests are performed by using inspection equipment. In particular, for the CAN-package semiconductor laser, the burn-in test is performed to all of the products. Furthermore, the CAN-package semiconductor laser is taken out from manufacturing equipment or set to inspection equipment by conveyor equipment.

The currently-used manufacturing equipment, inspection equipment and conveyor equipment of the CAN-package semiconductor laser are designed according to the outer shape and dimensions of the current CAN-package semiconductor laser. Therefore, if the CAN-package semiconductor laser is reduced in size and the outer shape thereof is changed, the various types of equipment used currently become unusable. On the other hand, much cost is required for changing the manufacturing equipment and others completely according to the size reduction of the CAN-package semiconductor laser and the change of the outer shape thereof. Also, it is expected that the CAN-package semiconductor laser is further reduced in size in the future, and still more cost is required for changing the manufacturing equipment and others every time when the CAN-package semiconductor laser is reduced in size. Although the manufacturing equipment, the inspection equipment and the conveyor equipment have been mentioned here, other equipment and devices handling the CAN-package semiconductor laser also have similar problems.

An object of the present invention is to make it possible to handle CAN-package semiconductor lasers having different outer shapes and dimensions by the same equipment and device.

A jig for a CAN-package semiconductor laser of the present invention is a jig for handling a CAN-package semiconductor laser having a semiconductor laser mounted on a pedestal, a cap which is put on one surface of the pedestal and covers the semiconductor laser, and a lead pin which is electrically connected to the semiconductor laser and protrudes from the other surface of the pedestal. This jig includes: a base part provided with a recessed part to which the pedestal is fitted; a terminal pad provided on a bottom surface of the recessed part and being in contact with the lead pin; and a terminal pin electrically connected to the terminal pad and protruding from the base part.

In an aspect of the present invention, a positioning protrusion or a positioning groove which is provided on an inner side surface of the recessed part and engaged with the pedestal is provided.

In another aspect of the present invention, a through hole which penetrates through the base part is provided, and when the pedestal is fitted to the recessed part, at least a part of the through hole is covered with the pedestal.

According to the present invention, it is possible to handle CAN-package semiconductor lasers having different outer shapes and dimensions by the same equipment and device.

BRIEF DESCRIPTIONS OF THE DRAWINGS

DESCRIPTIONS OF THE PREFERRED EMBODIMENTS

A jig for a CAN-package semiconductor laser of the present invention is a jig used when handling a CAN-package semiconductor laser in manufacturing equipment, inspection equipment, conveyor equipment and other equipment and devices. The structure of the CAN-package semiconductor laser has already been described above, but the structure of the CAN-package semiconductor laser will be described in further details for easy understanding of the present invention.

Figure 1A:
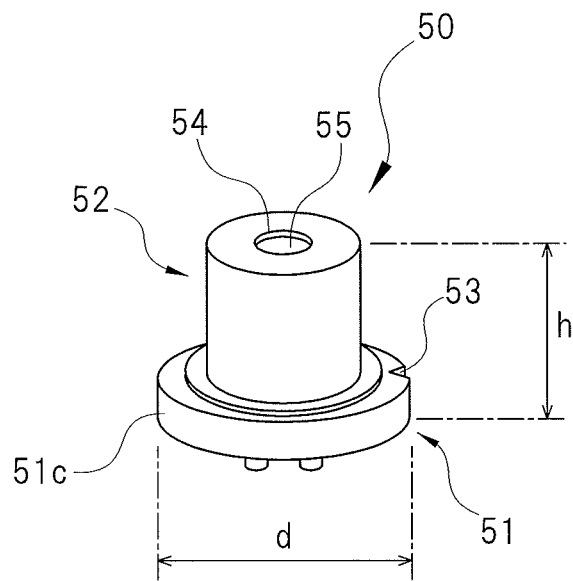
FIG. 1A is a perspective view of an example of a CAN-package semiconductor laser.

As shown in the drawings, a CAN-package semiconductor laser 50 has a metal pedestal 51 and a metal cap 52 put on one surface of the pedestal 51. As shown in FIG. 1, the pedestal 51 has a disk-like shape and the cap 52 has a cylindrical shape, and a diameter of the cap 52 is smaller than that of the pedestal 51. A diameter (d) of the pedestal 51 is 2 to 3 mm, and a height of the CAN-package semiconductor laser 50 including a thickness of the pedestal 51 is also 2 to 3 mm. Further, a positioning groove 53 having a substantially triangular cross section is formed on a side surface of the pedestal 51.

In a ceiling of the cap 52, a circular opening 54 is formed, and a disk-shaped cover glass 55 covering the opening 54 is attached to the inside of the ceiling. More specifically, the cap 52 has a glass window.

Figure 1B:
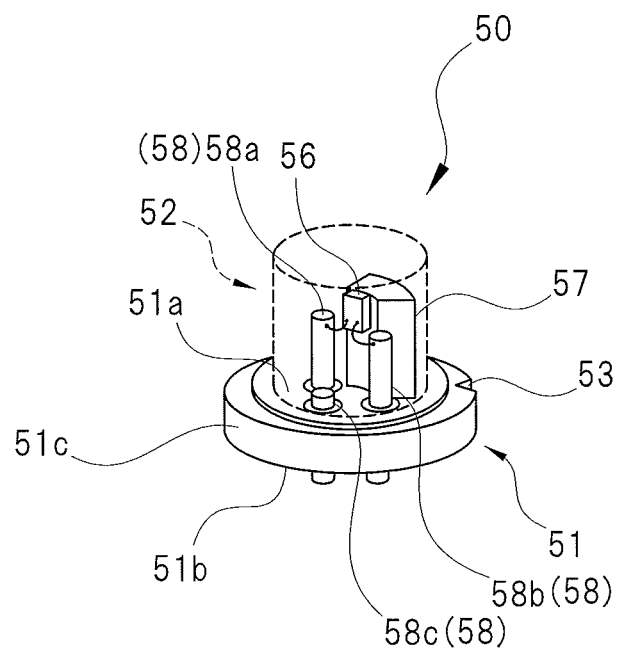
FIG. 1B is a transparent view of an internal structure of the CAN-package semiconductor laser shown in FIG. 1A.

As shown in FIG. 1B, a semiconductor laser (semiconductor laser chip) 56 is mounted on one surface of the pedestal 51 on which the cap 52 is put. Concretely, a stem 57 having a substantially fan-shaped cross section is provided on one surface of the pedestal 51, and the semiconductor laser 56 is attached onto a side surface of the stem 57. In the following descriptions, one surface of the pedestal 51 on which the stem 57 is provided is referred to as "pedestal upper surface 51a", and another surface opposite to the pedestal upper surface 51a is referred to as "pedestal lower surface 51b". Also, another surface (side surface) of the pedestal 51 having the positioning groove 53 provided thereon is referred to as "pedestal outer side surface 51c".

In the CAN-package semiconductor laser 50, a plurality of lead pins penetrating through the pedestal 51 are provided. A lead pin 58a shown in FIG. 1B is for anode, a lead pin 58b is for cathode, and a lead pin 58c is for monitor. Through not shown, a lead pin for ground is also provided in addition to the lead pins 58a, 58b and 58c.

One ends of the lead pins 58a, 58b and 58c protrude into the cap 52 from the pedestal upper surface 51a, and the other ends thereof protrude from the pedestal lower surface 51b. Meanwhile, one end of the lead pin for ground (not shown) is electrically connected to the stem 57 without protruding from the pedestal upper surface 51a, and the other end thereof protrudes from the pedestal lower surface 51b. In the following descriptions, the lead pins 58a, 58b and 58c shown in the drawings and the lead pin for ground (not shown) are collectively referred to as "lead pin 58" in some cases. More specifically, the CAN-package semiconductor laser 50 has four lead pins 58. Each of the lead pins 58 and the semiconductor laser 56 are appropriately connected through boding wires and others when needed. Laser light emitted from the semiconductor laser 56 is output through the cover glass 55 shown in FIG. 1A.

Figure 2:
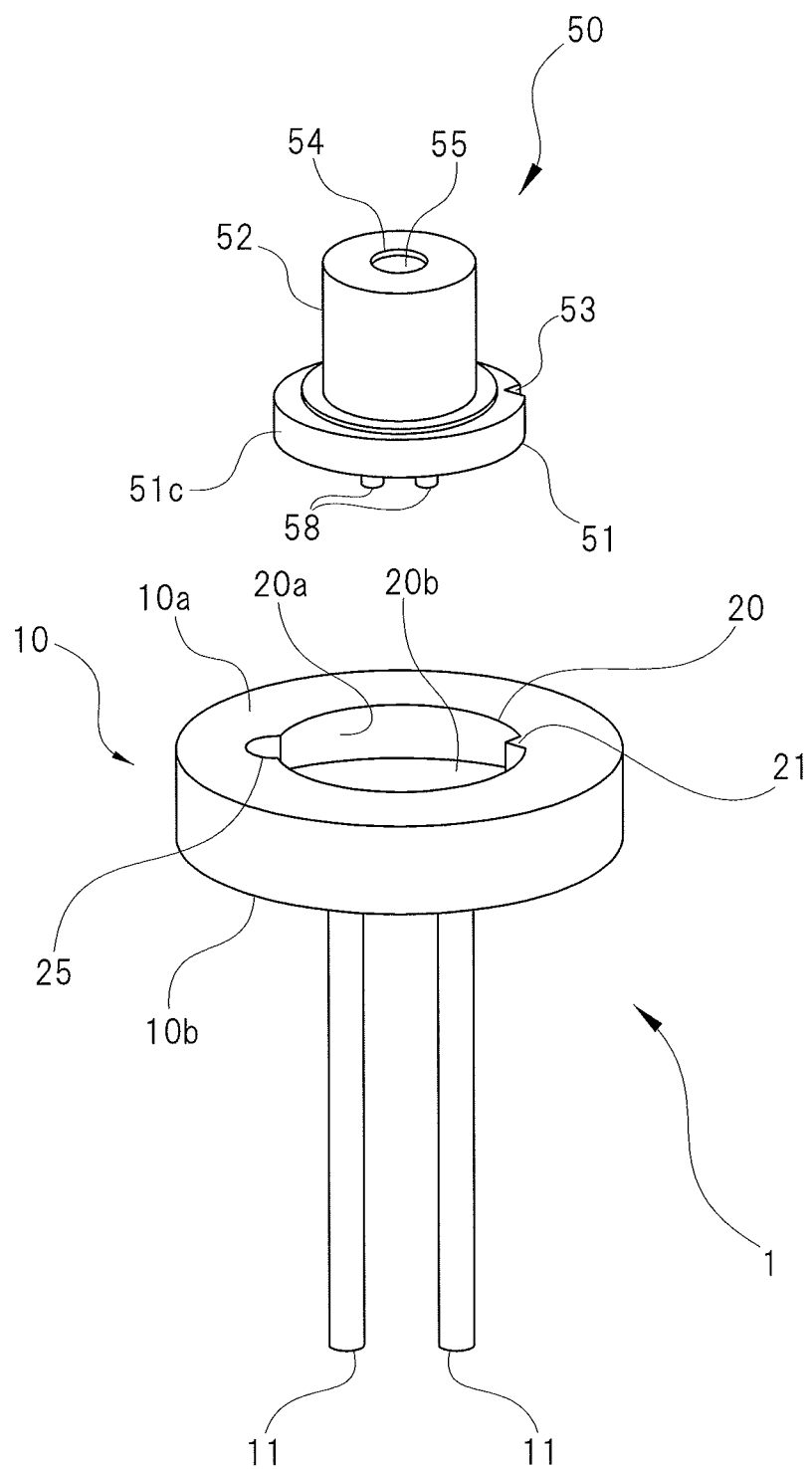
FIG. 2 is a perspective view of an example of a jig for a CAN-package semiconductor laser.

Next, a jig for a CAN-package semiconductor laser (hereinafter, abbreviated as "jig") according to this embodiment will be described. As shown in FIG. 2, a jig 1 has a disk-like base part 10 and a plurality of terminal pins 11 extending from the base part 10. The outer shapes and dimensions of the base part 10 and the terminal pins 11 are equal or substantially equal to the outer shapes and dimensions of the existing CAN-package semiconductor laser. The outer shapes and dimensions of the base part 10 and the terminal pins 11 of the jig 1 of this embodiment are equal or substantially equal to the outer shapes and dimensions of the pedestal and the lead pins of a TO-56 CAN.

On an upper surface 10a of the base part 10, a recessed part 20 to which the pedestal 51 of the CAN-package semiconductor laser 50 is fitted is provided. The recessed part 20 is a round hole whose diameter is slightly larger than that of the pedestal 51, and the center thereof coincides with the center of the base part 10. Also, a depth of the recessed part 20 is substantially equal to a thickness of the pedestal 51. In the following descriptions, the upper surface 10a of the base part 10 is referred to as "base-part upper surface 10a", and one surface opposite to the base-part upper surface 10a is referred to as "base-part lower surface 10b". More specifically, the recessed part 20 is formed on the base-part upper surface 10a and the terminal pins 11 are provided on the base-part lower surface 10b.

Figure 3:
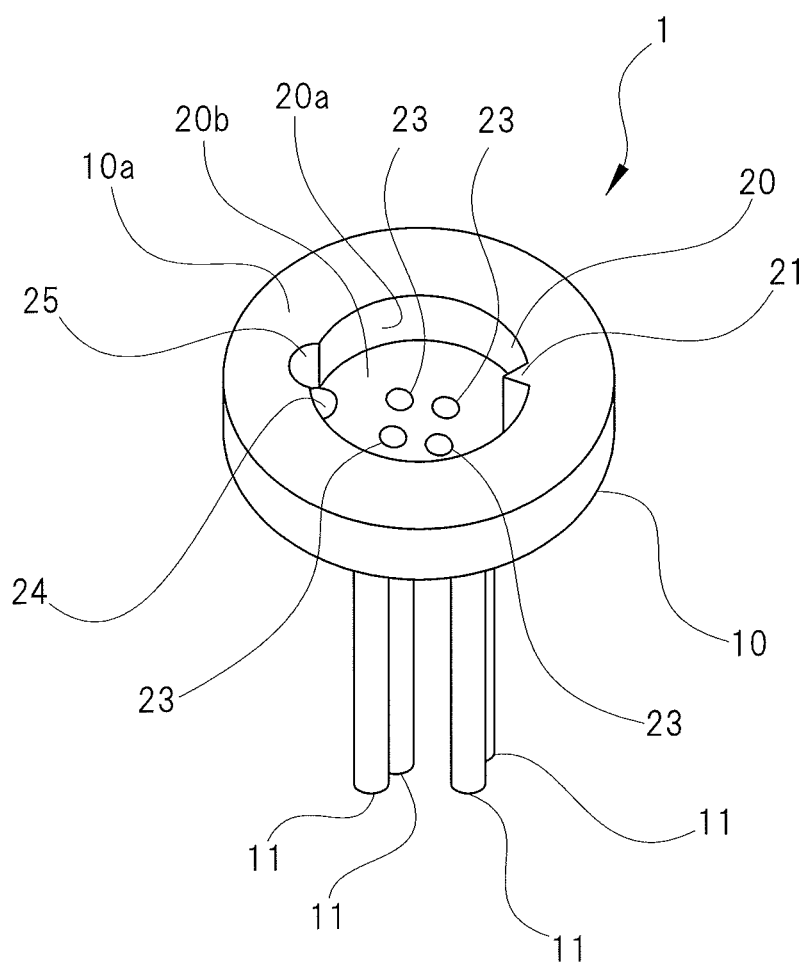
FIG. 3 is another perspective view of the CAN-package semiconductor laser shown in FIG. 2.

As shown in FIG. 3, on an inner side surface 20a of the recessed part 20, a positioning protrusion 21 having a triangular prism shape protruding toward the center of the recessed part 20 is provided. The positioning protrusion 21 extends from a bottom surface 20b of the recessed part 20 along a depth direction of the recessed part 20, and an upper end surface thereof is flush with the base-part upper surface 10a. Also, on the bottom surface 20b of the recessed part 20, four terminal pads 23 are provided. Each of the terminal pads 23 is electrically connected to a predetermined terminal pin 11. In the following descriptions, an inner side surface of the recessed part 20 is referred to as "recessed-part inner side surface 20a", and the bottom surface 20b of the recessed part 20 is referred to as "recessed-part bottom surface 20b".

A through hole 24 which penetrates through the base part 10 is formed in the recessed-part bottom surface 20b, and a semi-arc shaped cutout portion 25 which communicates with the through hole 24 is formed on the recessed-part inner side surface 20a. The cutout portion 25 extends from the recessed-part bottom surface 20b along the depth direction of the recessed part 20, one end thereof communicates with the through hole 24, and the other end thereof has an opening on the base-part upper surface 10a. The cutout portion 25 is formed at a position deviating from the positioning protrusion 21 by substantially 180 degrees and extends in parallel with the positioning protrusion 21.

Figure 4:
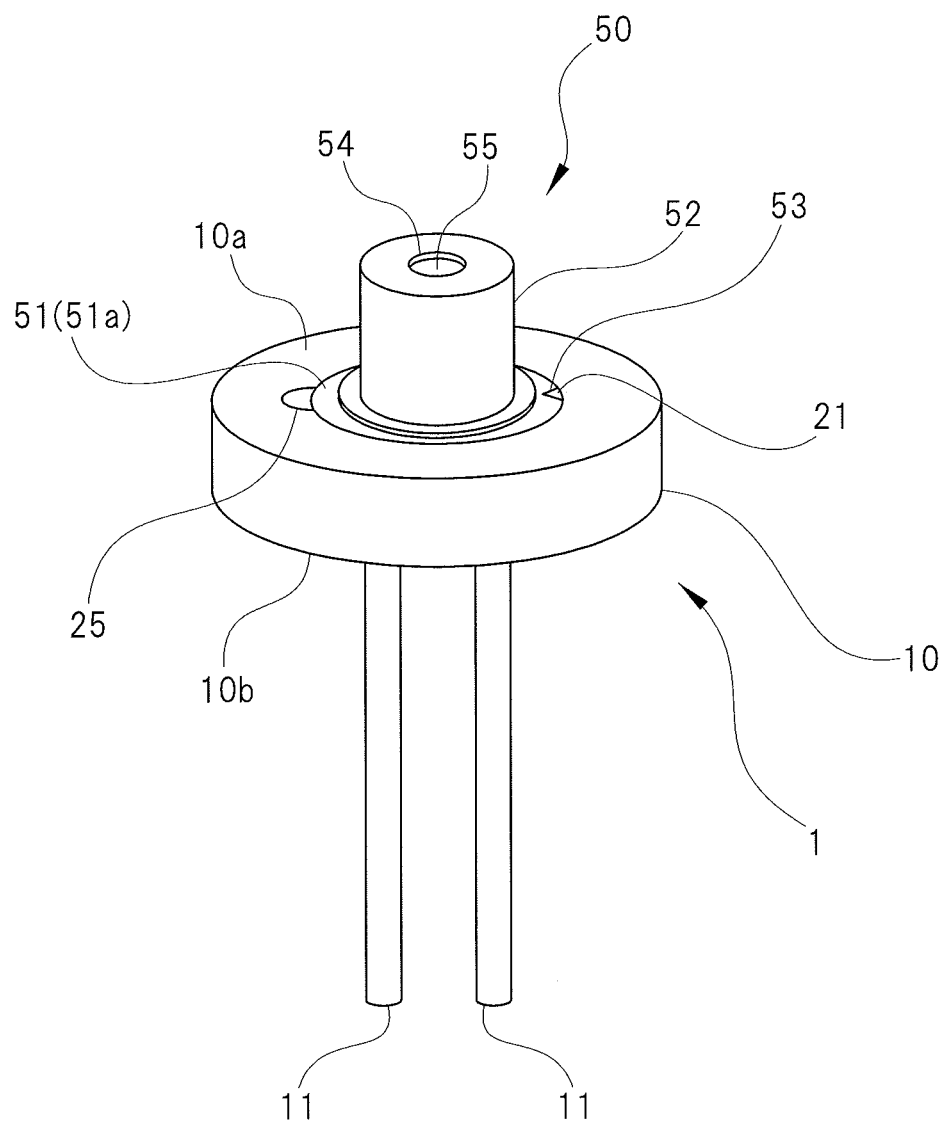
FIG. 4 is a perspective view of the jig for a CAN-package semiconductor laser shown in FIG. 2 to which a CAN-package semiconductor laser is set.

As shown in FIG. 2, the CAN-package semiconductor laser 50 is set from above onto the jig 1. Concretely, the pedestal 51 of the CAN-package semiconductor laser 50 is fitted to the recessed part 20 from above the base part 10. As described above, the diameter of the recessed part 20 is substantially equal to the diameter of the pedestal 51, and the depth of the recessed part 20 is substantially equal to the thickness of the pedestal 51. Therefore, as shown in FIG. 4, when the CAN-package semiconductor laser 50 is set to the jig 1, the recessed-part inner side surface 20a (FIG. 2) and the pedestal outer side surface 51c face each other with almost no clearance. Also, the base-part upper surface 10a and the pedestal upper surface 51a are substantially flush with each other.

Figure 5:
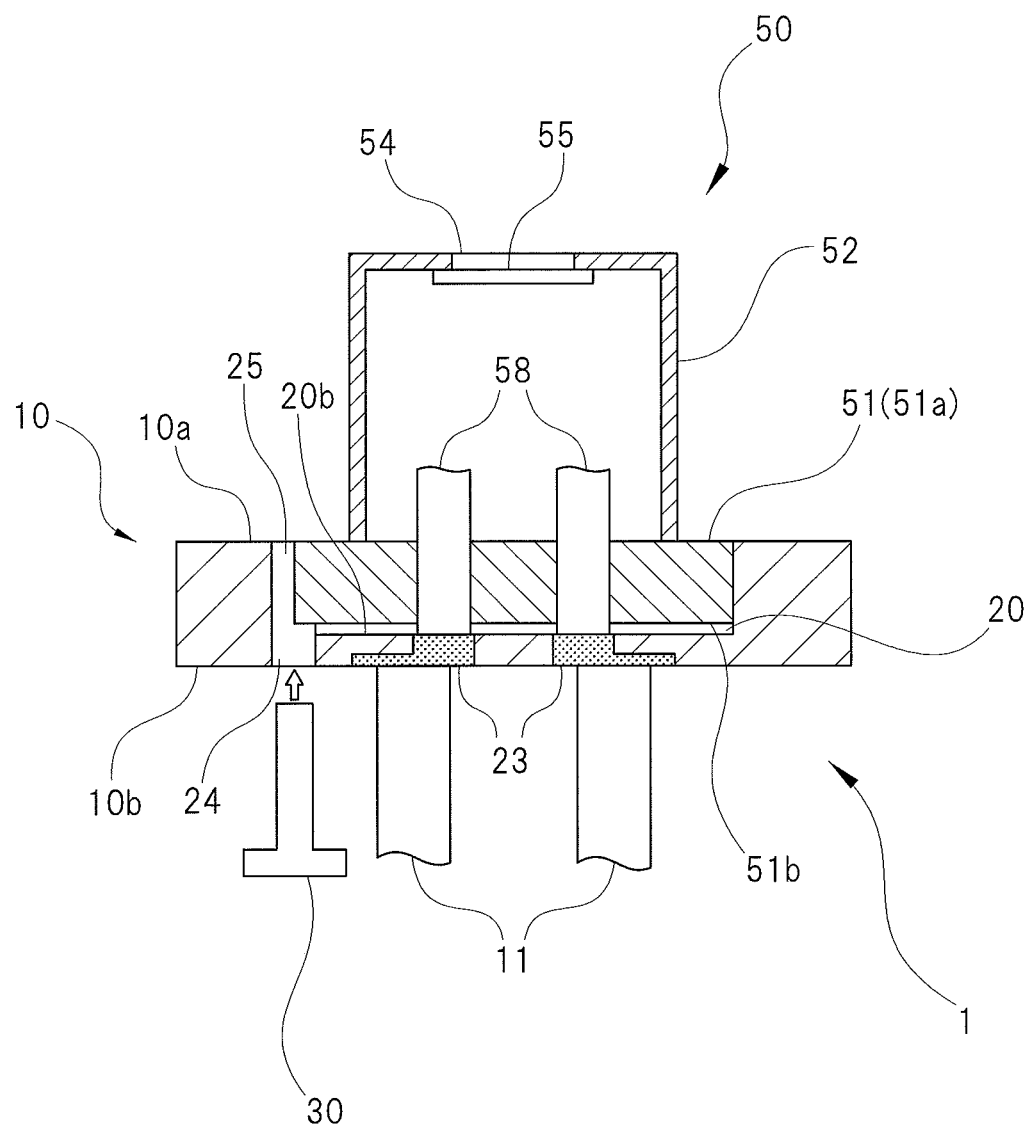
FIG. 5 is a schematic sectional view showing an electrical connection between the jig for a CAN-package semiconductor laser shown in FIG. 2 and a CAN-package semiconductor laser set thereto.

As shown in FIG. 2, when the CAN-package semiconductor laser 50 is set to the jig 1, the positioning protrusion 21 provided on the recessed-part inner side surface 20a is inserted into the positioning groove 53 provided on the pedestal outer side surface 51c and is engaged with the positioning groove 53. By the engagement between the positioning protrusion 21 and the positioning groove 53, the CAN-package semiconductor laser 50 is positioned relative to the jig 1, and the predetermined lead pin 58 comes in contact with the predetermined terminal pad 23 (FIG. 3). Concretely, as shown in FIG. 5, when the CAN-package semiconductor laser 50 is set to the jig 1, a lower end surface of the predetermined lead pin 58 is overlapped with an upper surface of the predetermined terminal pad 23. As a result, the predetermined terminal pin 11 of the jig 1 and the predetermined lead pin 58 of the CAN-package semiconductor laser 50 are electrically connected through the terminal pad 23. Here, the lead pin 58 of the CAN-package semiconductor laser 50 is shorter than a lead pin of a conventional CAN-package semiconductor laser so as to shorten the signal transmission distance. However, the lower end of the lead pin 58 slightly protrudes from the pedestal lower surface 51b. In other words, the lower end surface of the lead pin 58 is not flush with the pedestal lower surface 51b. Therefore, when the lower end surface of the lead pin 58 is overlapped with the upper surface of the terminal pad 23, clearance according to a protrusion length of the lead pin 58 is formed between the recessed-part bottom surface 20b and the pedestal lower surface 51b.

In FIG. 5, the terminal pin 11 extends from the lower surface of the terminal pad 23. In another embodiment, however, the terminal pin 11 may extend from a pad other than the terminal pad 23. For example, a pad connected to the terminal pad 23 through a through hole, a via plug or the like provided in the base part 10 is formed on the base-part lower surface 10b, and the terminal pin 11 may extend from this pad.

As shown in FIG. 4, the positioning protrusion 21 and the positioning groove 53 have the function to fix the position of the CAN-package semiconductor laser 50 by preventing the rotation of the CAN-package semiconductor laser 50 set to the jig 1.

As shown in FIG. 5, when the CAN-package semiconductor laser 50 is set to the jig 1, at least a part of the through hole 24 is covered with the pedestal lower surface 51b of the CAN-package semiconductor laser 50. In this embodiment, substantially half of the through hole 24 is covered with the pedestal lower surface 51b. In other words, a part of the pedestal lower surface 51b is exposed in the through hole 24. Therefore, by inserting a rod-like pusher 30 into the through hole 24 from a lower side of the base part 10 to push up the pedestal 51 from the recessed part 20, the CAN-package semiconductor laser 50 can be detached from the jig 1. Of course, the CAN-package semiconductor laser 50 can be detached from the jig 1 by picking up the cap 52 of the CAN-package semiconductor laser 50 protruding from the base-part upper surface 10a. However, when the cap 52 is picked up, a stress is generated on the cover glass 55, and the cover glass 55 could be damaged. Therefore, in order to reliably prevent the cover glass 55 from being damaged, the method of pushing up the CAN-package semiconductor laser 50 by the pusher 30 is preferable. Alternatively, the CAN-package semiconductor laser 50 can be pushed up by supplying compressed air into the through hole 24, and the CAN-package semiconductor laser 50 can be detached from the jig 1 also by this method while preventing the cover glass 55 from being damaged.

As described above, when the CAN-package semiconductor laser 50 is set to the jig 1 according to this embodiment, the overall outer shape and dimensions become equal or substantially equal to the outer shape and dimensions of the existing CAN-package semiconductor laser (TO-56 CAN in this embodiment). Therefore, the existing manufacturing equipment, inspection equipment, conveyor equipment and other equipment and devices designed according to the outer shape and dimensions of the TO-56 CAN and used can be continuously used as they are. Of course, the outer shape and dimensions of the base part 10 and the terminal pin 11 are not limited to the outer shape and dimensions of the pedestal and the lead pin of TO-56 CAN, but can be arbitrarily determined. More specifically, according to the jig 1, the outer shape and dimensions of the CAN-package semiconductor laser can be arbitrarily changed.

The present invention is not limited to the foregoing embodiments and various modifications and alterations can be made within the scope of the present invention. For example, a lead pin for anode or a lead pin for cathode functions also as a lead pin for ground in some CAN-package semiconductor lasers. Also, a lead pin for monitor is not provided in some CAN-package semiconductor lasers. Therefore, the number of terminal pins can be arbitrarily increased or decreased in accordance with the number of lead pins provided in the CAN-package semiconductor laser to be handled. On the other hand, it is also possible to provide an expected maximum number of terminal pins in advance. For example, the jig 1 of the above-described embodiment has four terminal pins 11. Therefore, when the number of lead pins provided in the CAN-package semiconductor laser to be handled is three or less, some of the four terminal pins 11 are dummy pins which are not connected to the CAN-package semiconductor laser.

In the above-described embodiment, the positioning protrusion 21 is provided in the jig 1, and the positioning groove 53 is provided in the CAN-package semiconductor laser 50. However, it is also possible to provide the positioning groove in the jig 1 and provide the positioning protrusion in the CAN-package semiconductor laser 50. Alternatively, it is also possible to provide both of the positioning protrusion and the positioning groove in the jig 1 and the CAN-package semiconductor laser 50.

The shape of the pusher 30 shown in FIG. 5 is just an example. The shape of the pusher 30 is not particularly limited to a specific shape as long as it can be inserted into the through hole 24 and can push out the CAN-package semiconductor laser 50 from the recessed part 20.

What is claimed is:

1. A jig for a CAN-package semiconductor laser, which is a jig for handling a CAN-package semiconductor laser having a semiconductor laser mounted on a pedestal, a cap which is put on one surface of the pedestal and covers the semiconductor laser, and a lead pin which is electrically connected to the semiconductor laser and protrudes from the other surface of the pedestal, the jig comprising:
    a base part provided with a recessed part to which the pedestal is fitted;
    a terminal pad provided on a bottom surface of the recessed part and being in contact with the lead pin;
    a terminal pin electrically connected to the terminal pad and protruding from the base part;
    a through hole which penetrates through the base part;
    wherein, when the pedestal is fitted to the recessed part, at least a part of the through hole is covered with the pedestal; and
    the through hole opens to opposite faces of the base part.

2. The jig for a CAN-package semiconductor laser according to claim 1,
    wherein the recessed part has a height which exposes only the cap of the CAN-package semiconductor laser.

3. A jig for a CAN-package semiconductor laser, which is a jig for handling a CAN-package semiconductor laser having a semiconductor laser mounted on a pedestal, a cap which is put on one surface of the pedestal and covers the semiconductor laser, and a lead pin which is electrically connected to the semiconductor laser and protrudes from the other surface of the pedestal, the jig comprising:
    a base part provided with a recessed part to which the pedestal is fitted;
    a terminal pad provided on a bottom surface of the recessed part and being in contact with the lead pin;
    a terminal pin electrically connected to the terminal pad and protruding from the base part; and a positioning protrusion or a positioning groove which is provided on an inner side surface of the recessed part and engaged with the pedestal.

4. The jig for a CAN-package semiconductor laser according to claim 3, further comprising:
a through hole which penetrates through the base part,
wherein, when the pedestal is fitted to the recessed part, at least a part of the through hole is covered with the pedestal.

5. The jig for a CAN-package semiconductor laser according to claim 4,
wherein the recessed part has a height which exposes only the cap of the CAN-package semiconductor laser.

6. The jig for a CAN-package semiconductor laser according to claim 4,
wherein the through hole is provided at a position facing the positioning protrusion or the positioning groove.

7. A jig for a CAN-package semiconductor laser, which is a jig for handling a CAN-package semiconductor laser having a semiconductor laser mounted on a pedestal, a cap which is put on one surface of the pedestal and covers the semiconductor laser, and a lead pin which is electrically connected to the semiconductor laser and protrudes from the other surface of the pedestal, the jig comprising:
a base part provided with a recessed part to which the pedestal is fitted;
a terminal pad provided on a bottom surface of the recessed part and being in contact with the lead pin;
a terminal pin electrically connected to the terminal pad and protruding from the base part; and
wherein an interval between the terminal pins is larger than an interval between the terminal pads.

* * * * *